United States Patent [19]
Walker et al.

[11] Patent Number: 5,371,027
[45] Date of Patent: Dec. 6, 1994

[54] METHOD OF MANUFACTURING A SEMICONDUCTOR DEVICE HAVING A NON-VOLATILE MEMORY WITH AN IMPROVED TUNNEL OXIDE

[75] Inventors: Andrew J. Walker; Robertus D. J. Verhaar, both of Eindhoven, Netherlands

[73] Assignee: U.S. Philips Corporation, New York, N.Y.

[21] Appl. No.: 29,255

[22] Filed: Mar. 10, 1993

[30] Foreign Application Priority Data

Mar. 12, 1992 [EP] European Pat. Off. ......... 92200707.5

[51] Int. Cl.⁵ ........................................ H01L 21/266
[52] U.S. Cl. ........................................ 437/43; 437/37; 437/941
[58] Field of Search ............... 437/24, 37, 43, 931, 437/941, 954, 932; 148/DIG. 34, DIG. 35, DIG. 132

[56] References Cited

U.S. PATENT DOCUMENTS

| | | | |
|---|---|---|---|
| 3,649,884 | 3/1972 | Haneta | 437/941 |
| 4,297,782 | 11/1981 | Ito | 437/37 |
| 4,717,943 | 1/1988 | Wolf et al. | 257/325 |
| 4,849,248 | 7/1989 | Hashimoto | 437/918 |
| 4,868,618 | 9/1989 | Kalnitsky et al. | 257/314 |
| 5,147,813 | 9/1992 | Woo | 437/43 |
| 5,210,042 | 5/1993 | Oshikawa | 437/29 |
| 5,236,851 | 8/1993 | Kameyama et al. | 437/30 |
| 5,250,455 | 10/1993 | Ohzone et al. | 437/37 |

OTHER PUBLICATIONS

Peek, et al., "Enhanced Tunneling in Implanted MOS Structures", Solid State Devices and Materials; 18th Conference, Aug. 20–22, 1986 pp. 487–490.

*Primary Examiner*—Brian E. Hearn
*Assistant Examiner*—Chandra Chaudhari
*Attorney, Agent, or Firm*—Steven R. Biren

[57] ABSTRACT

Very thin tunnel oxides are used in conventional non-volatile memories to obtain a sufficiently strong tunnelling current to or from the floating gate. Usual thicknesses of the tunnel oxide lie in the 8–10 nm range.

The invention renders it possible to use tunnel oxides of a much greater thickness, for example of the order of 20 nm, for comparable tunnelling current values. According to the invention, the tunnelling effect is enhanced by implantation of a heavy, high-energy ion, for example As, into a comparatively thin poly layer of the oxide. During this, Si atoms are propelled from the polylayer into the oxide, so that the oxide is enriched with Si, which causes a major change in the tunnelling characteristics. The same oxide which functions as a gate oxide elsewhere may be used for the tunnel oxide. An important advantage of the invention is that direct contact between the tunnel oxide and photoresist layers necessary during the process is avoided, so that the properties of the tunnel oxide are not or at least substantially not impaired by the photoresist.

10 Claims, 5 Drawing Sheets

METHOD OF MANUFACTURING A SEMICONDUCTOR DEVICE HAVING A NON-VOLATILE MEMORY WITH AN IMPROVED TUNNEL OXIDE

The invention relates to a method of manufacturing a semiconductor device whereby a semiconductor body is provided at a surface with a non-volatile memory element in the form of a MOS transistor with floating gate electrode, which transistor is separated from a subjacent surface region of the semiconductor body by silicon-enriched tunnel oxide. The invention also relates to a semiconductor device manufactured by such a method.

Such a method is known from, for example, U.S. Pat. No. 4,849,248.

MOS transistors with floating gate electrodes form the memory elements in many non-volatile memories known under the names EEPROM, EPROM, flash-EEPROM, flash-EPROM, etc. In all these types of memories, the written information is formed by the charge state of the floating gate electrode, and thus by the threshold voltage of the MOS transistor. Readout takes place by, for example, a control gate which usually lies above the floating gate, which is electrically insulated therefrom, and to which such a voltage can be applied during readout that the transistor becomes or does not become conducting, depending on the information stored.

Tunnelling of electrons from or to the floating gate electrode through the tunnel oxide is often used for charging or discharging of the floating gate electrode. To obtain a suitable tunnelling current, very thin tunnel oxide layers are required in conventional memories of the order of, for example, 8-10 nm. A number of disadvantages, however, are inherent in such thin layers. The thin tunnel oxide must be provided together with oxide layers of greater thickness which form gate oxides of the memory transistors and possibly of other MOS transistors. During manufacture it is practically always necessary to provide photoresist on the gate oxide already formed for the purpose of photolithographic operations, which may adversely affect the quality of the gate oxide. As to the operation of the device, the thin tunnel oxide has the effect that the capacitance between the floating gate electrode and surface zones in the semiconductor body is increased. These zones comprise, for example, portions of the semiconductor body adjacent the drain zone in the case of an EEPROM (Electrically Erasable PROM) and the source and drain zones in the case of, for example, a flash-EEPROM or flash-EPROM (Electrically Programmable ROM). Owing to this parasitic capacitance, the capacitance ratios between the floating gate and the control gate and between the floating gate and the semiconductor body become such that comparatively high voltages must be applied to the control gate for achieving the tunnelling effect. These high voltages may cause problems in the drive electronics and/or in the logic circuits in the case of a so-called embedded memory. It is often desirable, accordingly, to reinforce the tunnelling effect in the sense that the tunnelling current is sufficiently strong also at lower voltages. It should be ensured in this case, however, that the retention time of the memory is sufficiently long, i.e. that the information stored at the floating gate is maintained for a sufficient period and does not prematurely disappear owing to leakage of electric charge. It is often found in practice that reinforcement of the tunnelling effect is accompanied by an increase in leakage currents.

FIG. 13 of the cited U.S. Pat. No. 4,849,248 shows a device of the kind mentioned in the opening paragraph in which the tunnelling effect is reinforced in that the silicon content in the tunnel oxide is increased through implantation of silicon ions into the tunnel oxide. When the usual techniques are used, this known device also requires photoresist layers, both for defining the tunnel oxide and for local implantation of the silicon ions. In addition, a tunnel oxide is formed which is considerably thinner than the adjacent gate oxide, also in this known process.

SUMMARY OF THE INVENTION

The invention has for its object inter alia to provide a method of the kind mentioned in the opening paragraph whereby the tunnelling effect is reinforced without the retention time reaching an unacceptably low value. The invention also has for its object to indicate a simple method whereby the direct application of a photoresist layer on the gate oxide is avoided. A further object of the invention is to provide an EEPROM or EPROM memory based on the tunnelling effect in which the thickness of the tunnel oxide corresponds to the thickness of the usual gate oxides, while excessively high voltages at the control gate are avoided.

According to the invention, a method of the kind mentioned in the opening paragraph is characterized in that the tunnel oxide is enriched with silicon in that a silicon layer is deposited on the tunnel oxide and subsequently comparatively heavy ions are implanted into the silicon layer with such an energy that, at the given thickness of the silicon layer, silicon atoms are driven from the silicon layer into the tunnel oxide by the ion implantation.

It was found that a memory manufactured by the method described here has a satisfactory operation. The method according to the invention is very simple. After growing of the gate oxide, a thin layer of polycrystalline silicon is deposited, referred to hereinafter as poly or poly layer for short.

On this layer, a photoresist mask may subsequently provided, defining the tunnel oxide and separated from the gate oxide by the poly layer. The tunnelling current in the gate oxide is increased through implantation of heavy ions, such as As, after which the photoresist mask is removed again. In special cases, it may be advantageous to make the tunnel oxide thinner than the gate oxide. An embodiment which has the advantage inter alia that the capacitive coupling between the floating gate and the substrate is improved, is characterized in that a gate oxide of the same or at least substantially the same thickness as the tunnel oxide is provided between the floating gate electrode and a channel region of the MOS transistor. In this embodiment, it is in addition not necessary to carry out a separate oxidation step for providing the tunnel oxide, but the tunnel oxide can be formed simultaneously with the gate oxide. An embodiment in which the gate oxide/tunnel oxide is exposed to as few treatments as possible which could impair the quality of the oxide is characterized in that the floating gate electrode is formed at least partly from the silicon layer.

On the one hand, the thickness of the silicon layer must not be too small, to prevent the implanted ions being shot clean through the layer; on the other hand, the layer must not be too thick either, because it is difficult for the excited silicon atoms to reach the tunnel oxide in the case of a too great thickness. Experiments have shown that favorable values for the thickness of the silicon layer lie between 25 nm and 200 nm. Preferably, the thickness is at least approximately 100 nm. Specific values for the energy with which the ions are implanted into the silicon layer, depending inter alia on the thickness of the silicon layer and on the type of ions, lie in the range between approximately 50 KeV and 150 KeV. Preferably the implantation energy is at least approximately 80 KeV.

After the step involving implantation, the floating gate electrode may advantageously be defined from the silicon layer if the silicon layer is sufficiently thick in view of, for example, the resistance of the layer. An embodiment which is important especially for thinner silicon layers is characterized in that a polycrystalline silicon layer is deposited on the silicon layer after the implantation step, after which the floating gate electrode is defined from the combined layer. If the silicon layer is sufficiently thick for forming the floating gate, this layer may be doped with, for example, P before or after the implantation with heavy ions. If the silicon layer is too thin for the floating gate, it is preferably not doped until after the additional poly deposition.

BRIEF DESCRIPTION OF THE DRAWINGS

The invention will be explained in more detail with reference to several embodiments and the accompanying diagrammatic drawing, in which.

It is noted that the Figures are diagrammatic and not drawn to scale. Corresponding components in the various embodiments are usually given the same reference numerals. Semiconductor regions of the same conductivity type are generally hatched in the same direction.

DESCRIPTION OF THE PREFERRED EMBODIMENTS

Figure 1:
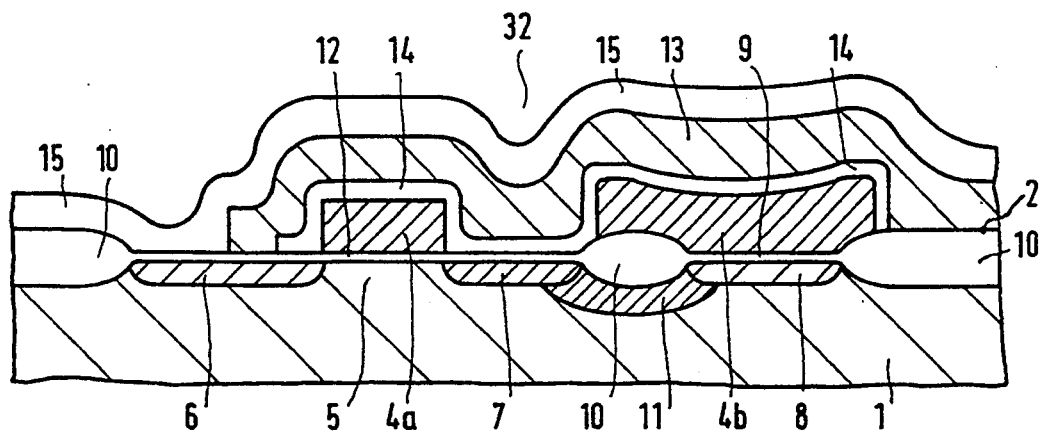
FIG. 1 is a cross-section of a semiconductor device manufactured by a method according to the invention.

FIG. 1 shows a semiconductor device with a semiconductor body 1 of silicon. Obviously, any other suitable semiconductor material may be used instead of silicon. The body 1 is provided at its surface 2 with a non-volatile memory element 3 in the form of an MOS transistor with floating gate electrode 4. Two portions 4a and 4b of the gate 4 are shown in the drawing, which portions are interconnected outside the plane of the drawing. It is noted that, although the letters M and O in the acronym MOS denote metal and oxide, respectively, the invention is not limited to this type of transistor, and that embodiments in which the gate electrode is made from a material other than metal, for example, of doped semiconductor material such as polycrystalline silicon, and/or in which the gate dielectric is not made of an oxide but of another material or of a combination of different materials, should also be regarded as covered by the term MOS transistor. The information is stored in the form of electric charge on the floating gate electrode 4 and determines the threshold voltage of the transistor. The gate electrode 4 is completely surrounded by dielectric material, so that the charge cannot flow away and the element obtains its non-volatile properties. The portion 4a of the floating gate lies over the channel 5 between the source 6 and the drain 7 of the transistor. The portion 4b of the floating gate lies over a surface region 8, also called tunnel region hereinafter, which is separated from the gate electrode 4 by the interposed tunnel oxide 9. At certain voltages between the gate 4 and the tunnel region 8, electrons can tunnel from the gate 4 to the region 8 or from the region 8 to the gate 4 through the tunnel oxide for adjusting the charge state of the gate 4. To increase the tunnelling effect, the tunnel oxide 9 is enriched with silicon, i.e. the silicon content in the layer 9 is higher than in the case of a stoichiometric composition of the layer 9. Thanks to this reinforced tunnelling effect, a sufficiently strong tunnelling current can be obtained also with a tunnel oxide of a greater thickness than usual, at comparatively low voltages. As a result of this the tunnel oxide may be provided, for example, with a thickness such as is usual for gate oxides of MOS transistors.

In this embodiment the semiconductor body 1, or at least a layer-shaped portion thereof adjoining the surface, is of the p-type. The transistor 3 is provided in an active region which is bounded by the comparatively thick field oxide 10. The transistor 3 of the n-channel type comprises n-type source/drain zones 6 and 7. The channel region 8 lies outside the transistor region in this embodiment and comprises an n-type zone 8 which is connected to the drain 7 by the n-type connection zone 11 provided under the field oxide 10. The tunnel oxide 9 separating the region 8 from the floating gate electrode 4 has the same or at least substantially the same thickness as the gate oxide 12 above the channel region of the transistor. The floating gate electrode 4 is of n-type doped polycrystalline silicon. Over the floating gate 4, a control electrode or control gate 13 is provided, which is also of n-type polycrystalline silicon. The poly layers 4 and 13 are separated by the interpoly dielectric 14 made of oxide, but which may alternatively be made of, for example, nitride or a combination of oxide and nitride. The thickness of the layer 14 is chosen so that the capacitive coupling between the gates 4 and 13 compared with the capacitive coupling between the gate 4 and the semiconductor body is as great as possible, because in that case the potential of the floating gate 4 can be most easily adjusted, i.e. i.e. with the smallest possible voltages at the control gate 13, for example, during writing or erasing. The thickness of the layer 14 is chosen to be not too great and the thickness of the oxide layers 9 and 12 is chosen to be not too small for this reason. Specific values for the thickness of the oxide layers 9/12 lie in the 12–40 nm range, for example 25 nm, and approximately 25 nm (effective oxide thickness) for the interpoly layer 14. The device is covered with a thick oxide layer 15 in which openings (not shown in the drawing) for contacts can be formed.

The device described here may be constructed as an EEPROM, in which case the transistor 3 is coupled through the drain to a selection transistor (not shown), whose gate is connected to a word line.

Figure 2:
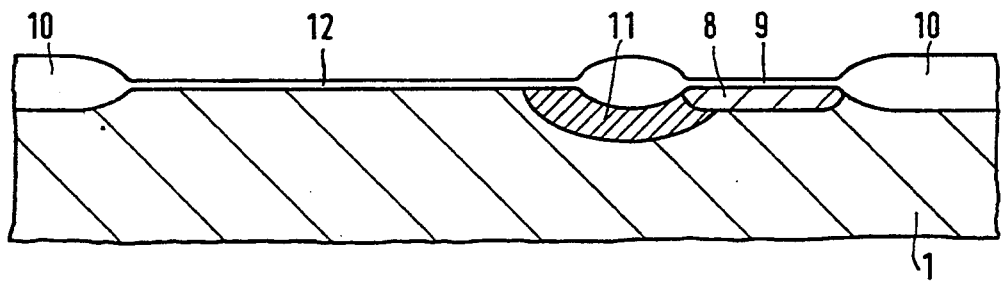
FIGS. 2-5 show the device of FIG. 1 in a number of stages of manufacture.

The manufacture of the device starts with a p-type silicon substrate 1 of a usual resistivity. The body 1 is first provided at the surface with a heavily doped n+zone, preferably doped with As, at the area of the connection zone 11 to be formed and, if necessary, with p-type channel stopper zones at the area of the field oxide 10 to be provided outside the region of the zone 11. These channel stoppers are not shown in the drawing. Then the field oxide 10 is provided in usual manner, whereby the connection zone 11 is obtained below the portion of the field oxide situated in the center of the drawing. Then the n-type zone 8 can be formed in the tunnel region by a phosphorus implantation. In view of the quality of the tunnel oxide to be grown over the zone 8, the doping concentration of the zone 8 is chosen to be comparatively low, for example, 1 to $2 \times 10^{18}$ atoms/cm$^3$. Any masking layers present on the surface can then be removed, after which the gate oxide 12 and the tunnel oxide 9 are simultaneously formed by thermal oxidation. The device is then in the stage shown in FIG. 2.

Figure 3:
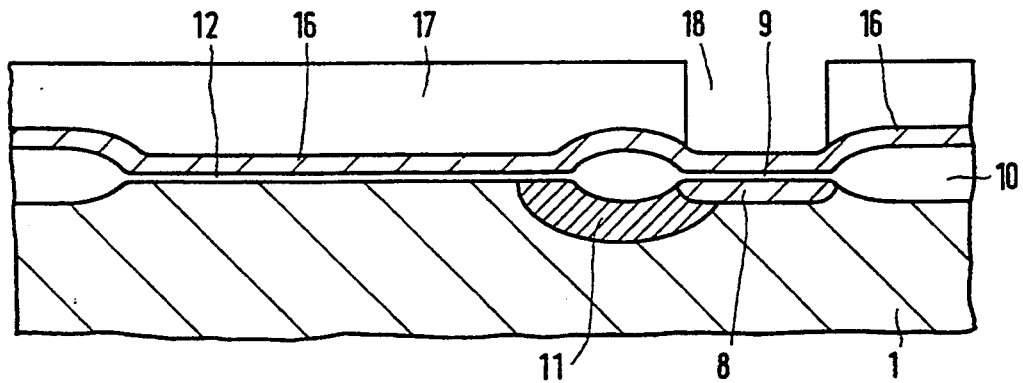
Figure 4:
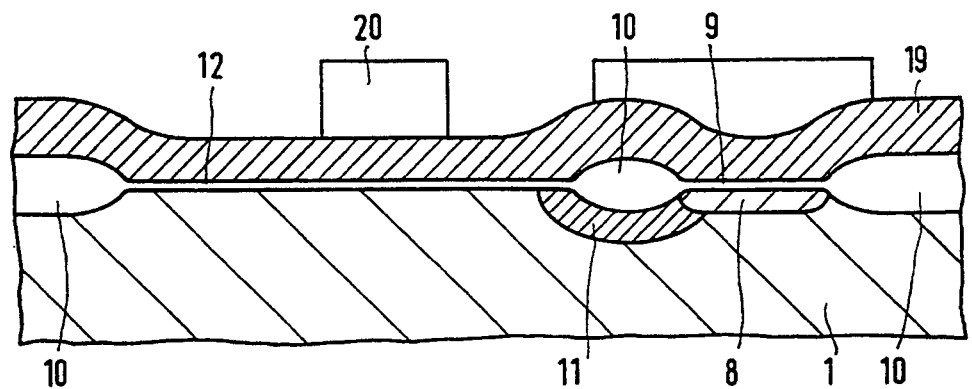
Figure 5:
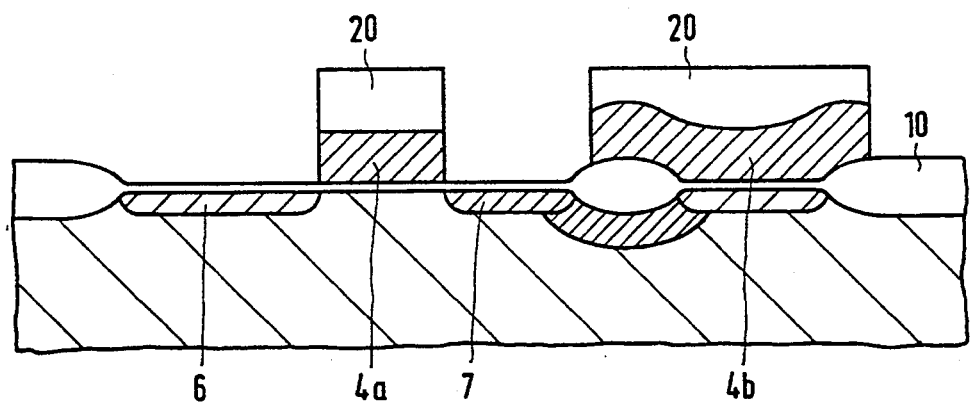
Figure 6:
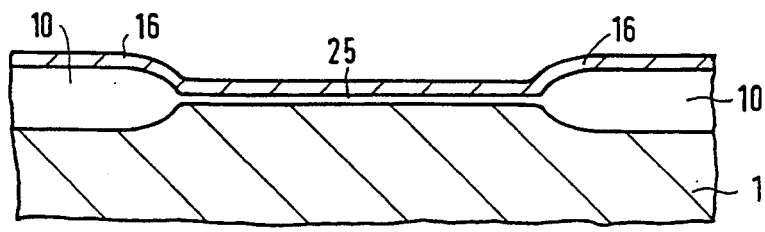
FIGS. 6-11 show a second embodiment of a method according to the invention.
Figure 7:
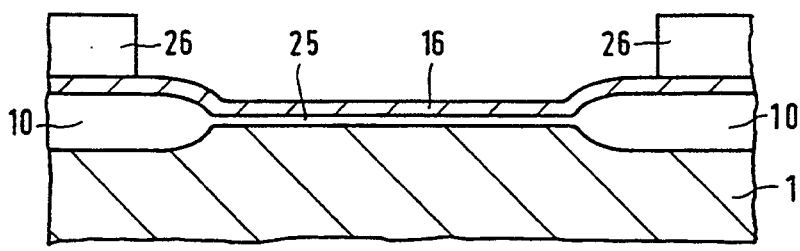

An amorphous or polycrystalline thin silicon layer 16 is deposited on the configuration thus obtained, see FIG. 3. The thickness of the silicon layer is approximately 100 nm. On the silicon layer 16, a photoresist layer is provided from which a doping mask 17 with an opening 18 at the area of the tunnel region 8 is formed. It is noted that the mask 17 is separated from the gate oxide 12 and the tunnel oxide 9 by the interposed silicon layer 16, so that it cannot or substantially not influence the quality of these oxide layers, as is often the case when photoresist is provided directly on oxide. The silicon layer 16 is subsequently subjected to an implantation treatment with comparatively heavy ions, compared with silicon, through the opening 18. The dopant for this implantation may be selected from several elements, for example, As, Sb, Ge, etc. In the present example, As is chosen which is implanted into the silicon layer 16 at an energy of between 50 KeV and 150 KeV, in particular at an energy of approximately 80 KeV. The implantation intensity is approximately 1 to $3 \times 10^{15}$ atoms per cm$^2$. The implantation energy and the thickness of the silicon layer 16 are such that the As+ ions are implanted into the silicon layer at least for the major part and that at most a negligible fraction ends up in the tunnel oxide and possibly in the substrate 1. During the implantation, As ions collide with silicon atoms so that, given the small thickness of the layer 16, silicon of the layer 16 is propelled into the tunnel oxide 9, thus forming a silicon-enriched region there. After the implantation, the photoresist mask 17 is removed and, if so desired, the silicon layer may be made thicker up to, for example, 500 nm. The silicon layer 19 thus obtained (FIG. 4) is then doped with, for example, P. In a next step, a photoresist mask 20 is formed which defines the floating gate 4, after which the unmasked portions of the silicon layer 19 are removed by, for example, reactive ion etching. The portions 4a and 4b have now been formed, as is shown in FIG. 5.

The n-type source/drain zones 6 and 7 are then formed. The device may be further finished by usual steps not shown in the drawing. First the mask 20 may be removed, after which the interpoly dielectric is provided, for example, through deposition from the gas phase. If the layer 14 is made of silicon oxide, the interpoly dielectric may obviously also be obtained through oxidation of the poly. After patterning of the layer 14, a second doped polycrystalline silicon layer is provided, from which the control gate 13 is formed. A glass layer 15 is provided over the entire assembly through deposition from the gas phase, which layer is provided with contact windows in usual manner, for example (outside the plane of the drawing), with the source 6 and/or drain 7 and/or with the control gate 13. After this the wiring may be formed in a single-layer or multilayer metallization in usual manner.

The memory cell described here may be operated at voltages which are comparable to the voltages usual for non-volatile memory elements having a very thin tunnel oxide (8 nm or less), with comparable values for the tunnelling current. Thus, for example, the tunnelling current was approximately 10 nA at a voltage of 10 V between the floating gate 4 and the tunnel region 8 in a practical embodiment. The capacitive coupling between the floating gate 4 and the substrate 1 is reduced by the comparatively thick tunnel oxide, which offers advantages for the operation of the device. Since the tunnel oxide can be formed simultaneously with the normal gate oxide, the manufacture of the device is considerably simplified. It should furthermore be noted in particular that the photoresist layers required in the various stages are not provided directly on the gate oxide 12 or the tunnel oxide 9 in the process described here, so that they cannot or practically not impair the quality of the subjacent oxide.

Figure 8:
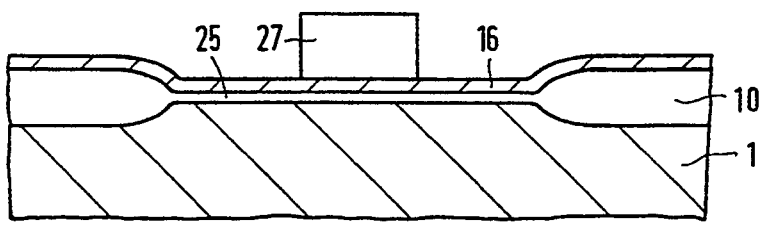
Figure 9:
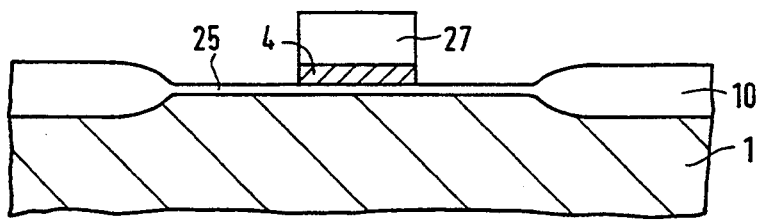
Figure 10:
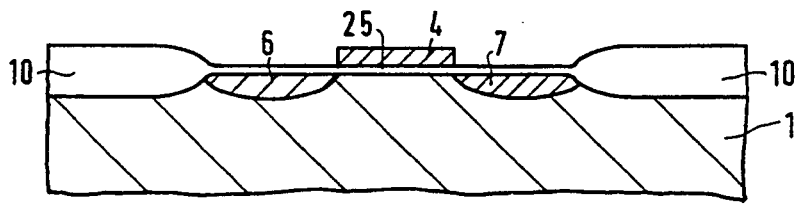

FIGS. 6–11 are cross-sections of a semiconductor device manufactured according to a second embodiment of a method according to the invention, in various stages of the process. The device, which in this case may form part of a flash-EEPROM, again comprises a p-type silicon substrate 1 in which active regions are defined at the surface by the field oxide 10. A gate oxide layer 25 of the same thickness as the oxide layer 12 in the preceding embodiment is provided on the surface of the active region. Then a comparatively thin polycrystalline silicon layer 16 is again deposited over the entire surface, FIG. 6. In a next step, see FIG. 7, a photoresist mask 26 is provided on the silicon layer 16 for the implantation which reinforces the tunnelling effect. Although this implantation need only be carried out over part of the active region, the mask 26 in the embodiment shown here leaves the entire active region exposed. It is true that portions of the gate oxide next to the tunnelling oxide to be formed are enriched with silicon thereby, but this does not pose a problem because these portions of the gate oxide can be removed in a next step. In some cases the mask 26 may be entirely omitted, so that the silicon layer 16 is exposed to the implantation over its entire surface. Often, however, it is desirable to mask the surface locally, for example, in view of the transistors in the peripheral circuits. After the mask 26 has been provided, the treatment reinforcing the tunnelling effect is carried out again in the same manner as in the preceding embodiment, through implantation of, for example, As ions into the silicon layer 16 at such an energy that silicon atoms are implanted into the gate oxide 25 as a result of this implantation. The gate oxide 25 is accordingly enriched with silicon over the entire active region shown in the drawing. After the implantation, the mask 26 is removed and the silicon layer may be made thicker, if so desired, and may be doped with P or some other suitable impurity. When the silicon layer 16 has the desired thickness and resistivity, the floating gate electrode may be defined by means of the photoresist mask 27 (FIG. 8). The floating gate electrode 4 is obtained by removal of the non-masked polycrystalline material (FIG. 9). The n-type source and drain zones 6 and 7 are formed by, for example, implantation of Asions and a heat treatment (FIG. 10). The photoresist mask 27 may then be removed. Then the interpoly dielectric 14 may be provided by deposition, followed by the deposition of a second poly layer. These layers are patterned in usual manner (FIG. 11) to obtain the control gate 13 which overlaps the floating gate 4. The portion of the gate oxide 25 not covered by the floating gate 4 is also removed. The oxide with reinforced tunnelling effect, accordingly, is limited entirely to the portion situated below the gate 4. The process may be continued in usual manner with the application of a glass layer over the entire assembly, etching of contact windows therein, and the provision of the metallization.

The device described here may be used in a so-called flash-EEPROM, in which electrons tunnel from the substrate (or source or drain) to the floating gate or from the floating gate to the substrate (or source or drain) during writing and erasing. Obviously, the device may also be operated as an EEPROM when a selection transistor is connected in series with the floating gate transistor.

Figure 11:
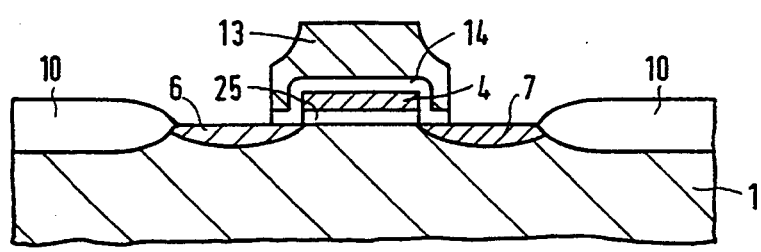
Figure 12:
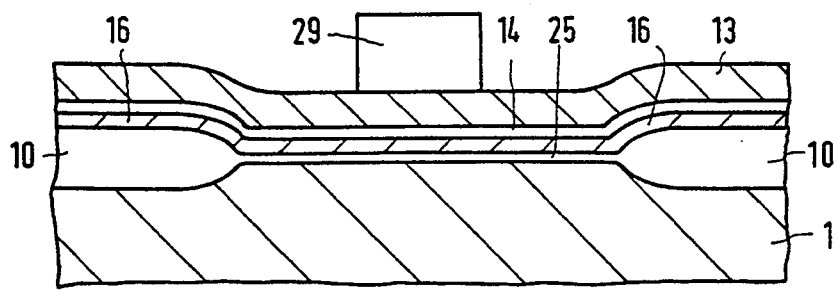
FIGS. 12-14 show a third embodiment of a method according to the invention.
Figure 13:
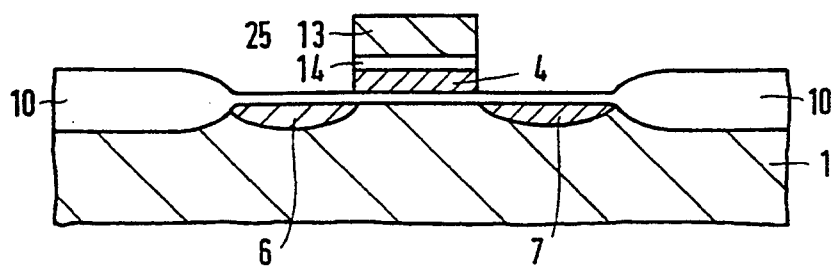
Figure 14:
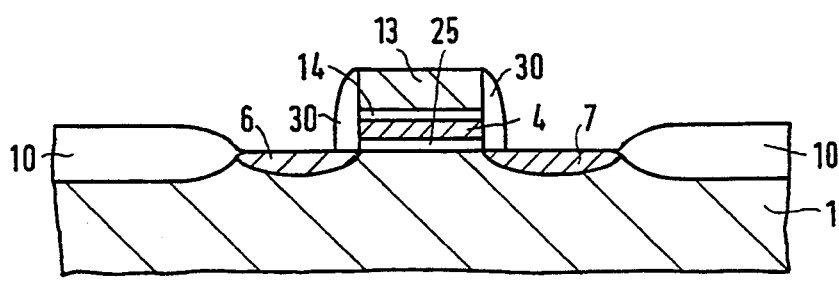

As can be seen in FIG. 11, the control gate 13 overlaps the floating gate 4. A configuration in which this overlap does not occur and which as a result can be smaller and thus particularly suitable for being integrated with other elements into a large memory is known under the designation "stacked EEPROM". A method according to the invention for the manufacture of a stacked EEPROM is described in the next embodiment with reference to FIGS. 12-14, which in cross-section show a memory element in various stages of manufacture. Manufacture runs in an analogous manner compared with the process described in the preceding example up to and including the stage depicted in FIG. 7, where the oxide layer 25 is enriched with silicon through implantation with heavy ions, for example, As ions, into the silicon layer 16. By a method which is known per se, a pattern of lanes can be formed from the silicon layer 16 by means of a photoresist mask, after which the photoresist mask is removed again. Such a lane is shown in the plane of the drawing in the cross-section of FIG. 12. Then the interpoly dielectric layer 14 and the second poly layer 13 are provided. After this the photoresist mask 29 is formed, FIG. 12, defining the gate configuration. The layers 13, 14 and 16 are etched one after the other, so that the stack shown in FIG. 13 is obtained with the floating gate 4, the interpoly dielectric 14, and the control gate 13. The control gate 13 does not overlap the floating gate 4 any more (at least in the plane of the drawing) so that a somewhat more compact structure than in the preceding embodiment is obtained. In a next step, the source and drain zones 6 and 7 are formed through implantation of As and the photoresist mask 29 is removed again. In a next step, shown in FIG. 14, the flanks of the poly stack are covered with an insulating layer 30, for example, in the form of so-called spacers. These may be provided in known manner, for example, through oxidation of the sides of the stack and/or anisotropic etching back of a layer of oxide or another suitable insulating material which was deposited over the entire assembly. During this, the tunnel oxide not covered by the floating gate may be simultaneously removed to obtain contact windows, so that the tunnel oxide is strictly limited to the channel region of the transistor.

Figure 15:
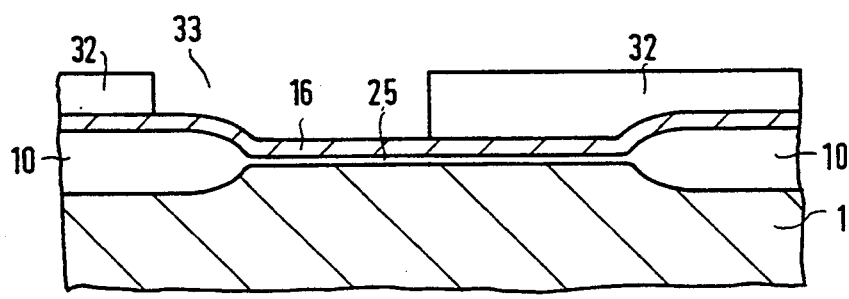
FIGS. 15-18 show a fourth embodiment of a method according to the invention.
Figure 16:
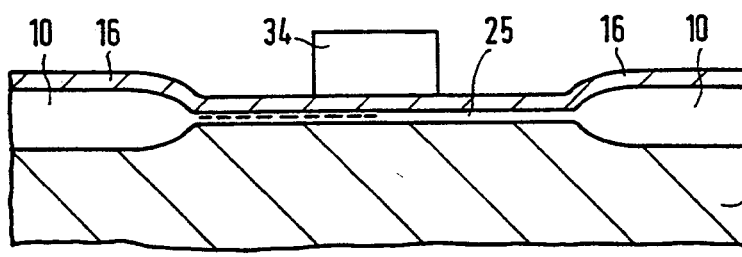
Figure 17:
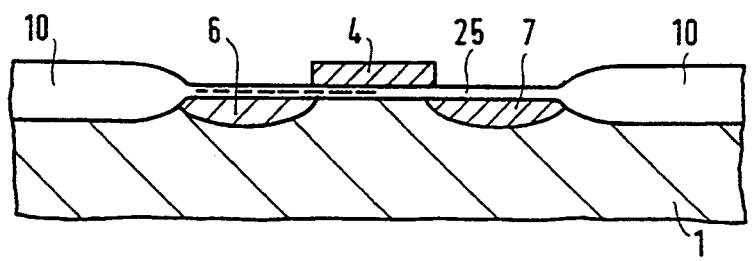
Figure 18:
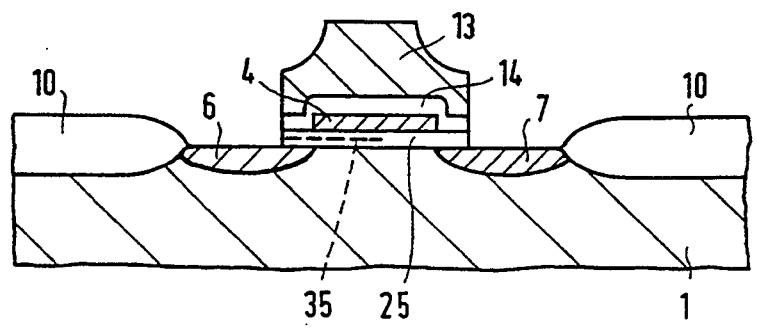

With the next embodiment, a method according to the invention is described for manufacturing a flash-EPROM in which charge is applied to the floating gate through injection of hot electrons from the substrate and in which on the other hand electrons can tunnel from the floating gate to the substrate. FIG. 15 shows in cross-section the device in the stage where, after growing of the gate oxide 25 and the thin poly layer 16, the photoresist mask 32 is provided on the surface. The photoresist mask 32 masks a substantial portion of the active region, at least a portion of the channel of the transistor to be formed. The implantation with high-energy heavy ions, for example, As ions, as described above is carried out through the opening 33 in the mask 32 for enriching the gate oxide 25 with silicon to reinforce the tunnelling effect. Since the enrichment is only local in this example, the enriched region in FIGS. 16-18 is marked with a broken line in the gate oxide 25. After the As implantation, the polylayer 16 is made thicker, if so desired, and doped with, for example, P, after which the mask 34 is provided over the floating gate to be formed (FIG. 16). The floating gate 4, see FIG. 17, is then formed from the polylayer 16 by etching, after which the source and drain zones 6 and 7 are formed through implantation of As ions into the substrate 1. In a next stage, the interpoly dielectric and the second poly layer are deposited, after which the structure shown in FIG. 18 is obtained through etching. The device may be further completed with the usual steps.

The control gate 13 overlaps the floating gate 4 on either side. The silicon-enriched tunnel oxide 35 represents only a portion of the gate oxide 25, in this example a portion adjoining the source zone 6. During writing, hot electrons can be injected onto the floating gate 4 through the gate oxide 25 near the drain 7. During erasing, this charge can tunnel to the source zone 6 through the tunnel oxide 35.

Figure 19:
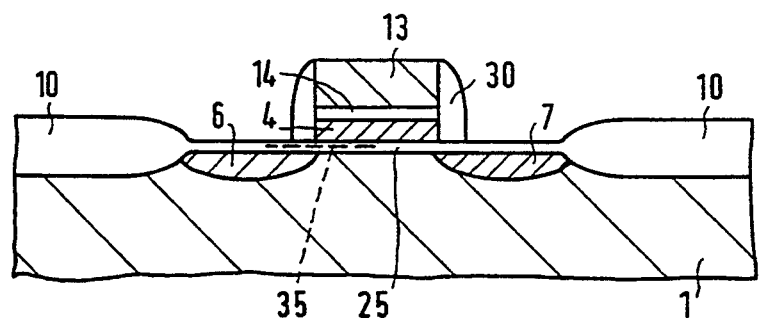
FIG. 19 is a cross-section of a further embodiment of a semiconductor device manufactured by means of a method according to the invention.

FIG. 19 is a cross-section of a modification of the structure shown in FIG. 18, in which the floating gate 4, the interpoly dielectric 14, and the control gate 13 are provided as a stack. The tunnel oxide 35 is again situated near the source zone 6, similar to the preceding embodiment. The manufacturing process for the device is largely identical to the method described above, obviously with the exception of the mask 34 defining the gate, which is not provided until after the deposition of the second poly layer.

It will be obvious that the invention is not limited to the embodiments given here, but that many modifications are possible to those skilled in the art. Thus other heavy ions may be used for enriching the tunnel oxide with silicon instead of As ions, such as, for example, Sb, Ge, Si and Kr.

We claim:

1. A method of manufacturing a semiconductor device wherein a semiconductor body is provided at a surface with a non-volatile memory element in the form of a MOS transistor with a floating gate electrode, said transistor being separated from a subjacent surface region of the semiconductor body by a silicon-enriched tunnel oxide, characterized in that the tunnel oxide is enriched with silicon by depositing a silicon layer on the tunnel oxide and subsequently implanting ions into the silicon layer with sufficient energy such that silicon atoms are driven from the silicon layer into the tunnel oxide by the ion implantation.

2. A method as claimed in claim 1, characterized in that a gate oxide of at least substantially the same thickness as the tunnel oxide is provided between the floating gate electrode and a channel region of the MOS transistor.

3. A method as claimed in claim 1, characterized in that the floating gate electrode is formed at least partly from the silicon layer.

4. A method as claimed in claim 1, characterized in that the silicon layer is provided to a thickness of between 25 and 200 nm.

5. A method as claimed in claim 4, characterized in that the silicon layer is provided to a thickness of approximately, 100 nm.

6. A method as claimed in claim 1, characterized in that a polycrystalline silicon layer is deposited on the silicon layer after the implantation step, to form a combined layer after which the floating gate electrode is defined from the combined layer.

7. A method as claimed in claim 1, characterized in that As ions are used as the ions which are implanted into the silicon layer.

8. A method as claimed in claim 1, characterized in that the ions are implanted into the silicon layer with an energy of between 50 and 150 KeV.

9. A method as claimed in claim 8, characterized in that the ions are implanted into the silicon layer with an energy of approximately, 80 KeV.

10. A method as claimed in claim 1, characterized in that, in a doping step separate from the said implantation, a doped surface zone is provided in the semiconductor body below the tunnel oxide, said surface zone forming an injector region from which charge carriers tunnel to the floating gate electrode during writing or erasing.

* * * * *